(12) United States Patent
Yim

(10) Patent No.: US 6,974,756 B2
(45) Date of Patent: Dec. 13, 2005

(54) METHODS OF FORMING SHALLOW TRENCH ISOLATION

(75) Inventor: Teresa Yim, Jeju-si (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 11/021,803

(22) Filed: Dec. 23, 2004

(65) Prior Publication Data

US 2005/0136614 A1  Jun. 23, 2005

(30) Foreign Application Priority Data

Dec. 23, 2003 (KR) .................. 10-2003-0095629

(51) Int. Cl.[7] ........................................... H01L 21/762
(52) U.S. Cl. .................. 438/424; 438/734; 438/750; 438/700
(58) Field of Search ................. 438/424, 734, 438/700, FOR 227, 750; 257/E21–243

(56) References Cited

U.S. PATENT DOCUMENTS

| | | | |
|---|---|---|---|
| 5,137,843 A | 8/1992 | Kim et al. ............... 437/70 |
| 5,358,893 A | 10/1994 | Yang et al. ............... 437/70 |
| 5,783,097 A * | 7/1998 | Lo et al. ................ 216/41 |
| 6,162,739 A * | 12/2000 | Sumnitsch et al. ........ 438/745 |
| 6,291,315 B1 * | 9/2001 | Nakayama et al. ........ 438/459 |
| 6,340,624 B1 * | 1/2002 | Doan et al. ............. 438/433 |
| 6,764,920 B1 | 7/2004 | Yang et al. ............. 438/424 |
| 6,777,336 B2 | 8/2004 | Lin et al. .............. 438/691 |
| 2004/0110354 A1 * | 6/2004 | Natzle et al. ........... 438/365 |

* cited by examiner

Primary Examiner—George Fourson
(74) Attorney, Agent, or Firm—Hanley, Flight & Zimmerman LLC

(57) ABSTRACT

A method of forming a shallow trench isolation is disclosed. An example method of forming a shallow trench isolation performs a planarization process for a substrate on which a hard mask and an insulation layer are formed, selectively etching the insulation layer on the edge of the substrate by using wet etch equipment, and performs a main etching process in the center region of the substrate.

4 Claims, 3 Drawing Sheets

METHODS OF FORMING SHALLOW TRENCH ISOLATION

RELATED APPLICATION

This application claims the benefit of Korean Application No. 10-2003-0095629, filed on Dec. 23, 2003, which is hereby incorporated herein by reference in its entirety.

TECHNICAL FIELD

The present disclosure relates to a method of forming a shallow trench isolation (hereinafter referred to as "STI") and, more particularly, to a method of removing the residual insulation layer on the edge of a substrate after a planarization process.

BACKGROUND

As semiconductor devices are becoming more highly integrated and compact, the scale-down of transistors used in semiconductor devices is accelerated. However, these transistors are facing the problems in that the channel length becomes shorter and an electrical short between terminals like a punch-through takes place.

Therefore, recently, for the purpose of preventing a bird's beak and the punch-through which afflict conventional methods such as local oxidation of silicon (hereinafter referred to as "LOCOS") and SEPOX (selective polysilicon oxidation), a new method called an STI method by which a shallow trench is formed has been introduced.

Referring to FIG. 1a, a pad oxide layer 12 and a pad nitride layer 13 are sequentially formed on a semiconductor substrate 11. Next, a photoresist is coated on the resulting substrate and an exposure process for the photoresist is carried out by using a reticle. The photoresist is then etched to form a photoresist pattern. After some part of the pad nitride layer 13 in which an STI will be formed is etched by using the photoresist pattern as a mask, the photoresist pattern is removed through a strip process. Similarly, the pad oxide layer 12 is etched by using the pad nitride layer 13 as a mask. By using the patterned pad oxide layer 12 and pad nitride layer 13 as a hard mask, the semiconductor substrate 11 is etched to the required depth to complete a trench 14.

Referring to FIG. 1b, after the etching process, the trench 14 has sharp edges that can cause the centralization of a voltage applied to a gate electrode to be formed later. To prevent this, a thermal oxide layer 15 is formed with a thickness of 200 Å by carrying out a thermal treatment of the trench 14 so that the edges become blunt.

Referring to FIGS. 1c and 1d, after the trench 14 is filled by an oxide layer 16, the resulting surface is planarized by a CMP (chemical mechanical polishing). As the residual pad nitride layer 13, i.e. the hard mask, and the pad oxide layer 12 are removed, an STI 16a is finally formed to isolate each unit device.

However, referring to FIG. 2a, if the STI is formed by the known method described above, CD (critical dimension) of the STI on the edge of the substrate as well as its depth becomes smaller. Furthermore, referring to FIG. 2b, as the insulation layer on the edge 22 of the substrate has a more even surface than its center 21, an etch rate becomes worse during the planarization process, so that the residual insulation layer 23 remains on the hard mask and obstructs the removal of the hard mask during the subsequent wet etch for the hard mask.

DETAILED DESCRIPTION

The processes prior to the removal of the residual insulation layer are known. First, a hard mask is formed on a substrate and a trench is completed by etching the substrate. An STI is formed by filling an insulation layer into the trench. The hard mask may be made of nitride and the insulation layer for filling the trench may be made of oxide. Next, the substrate including the hard mask and the insulation layer is planarized by a CMP process. Residual insulation layer remains on the hard mask on the edge of the substrate.

Figure 1A:
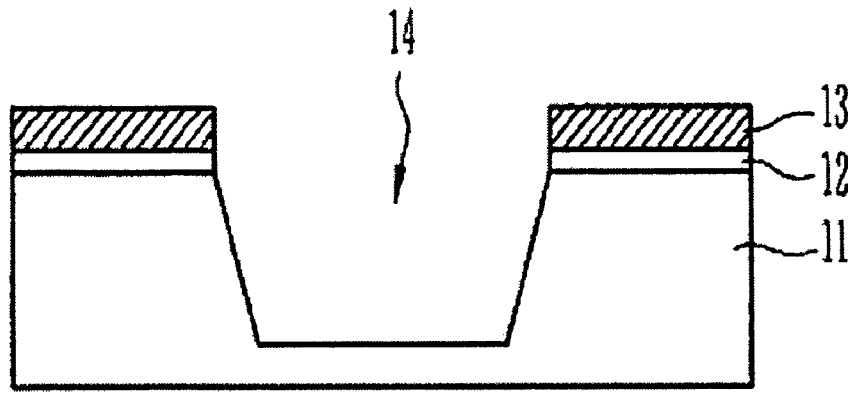
FIGS. 1a through 1d are cross-sectional views illustrating a known method of forming an STI.
Figure 1B:
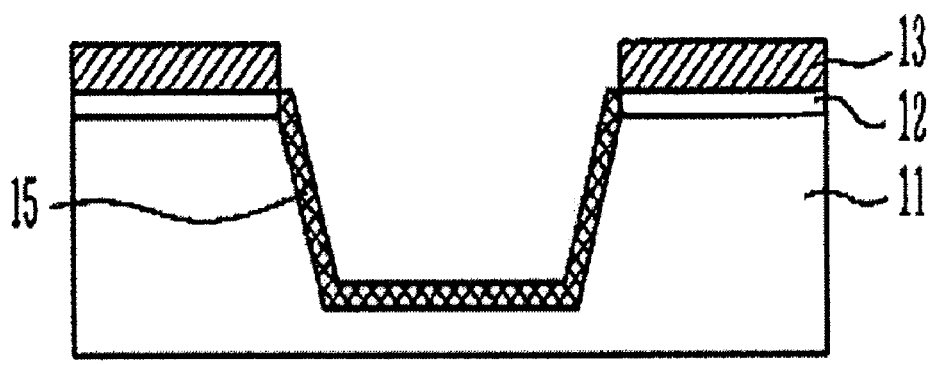
Figure 1C:
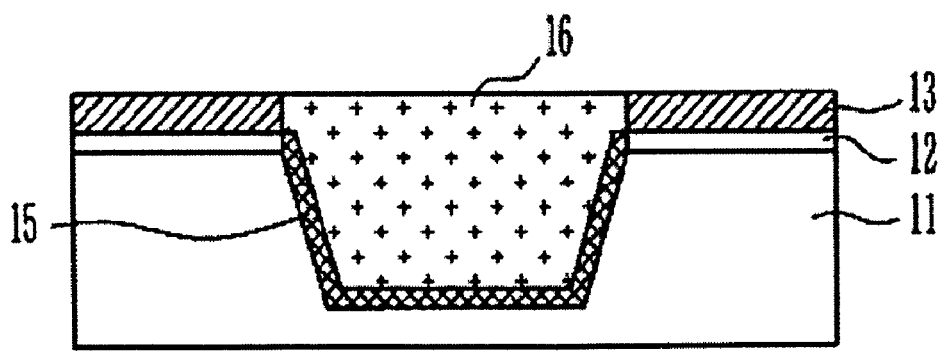
Figure 1D:
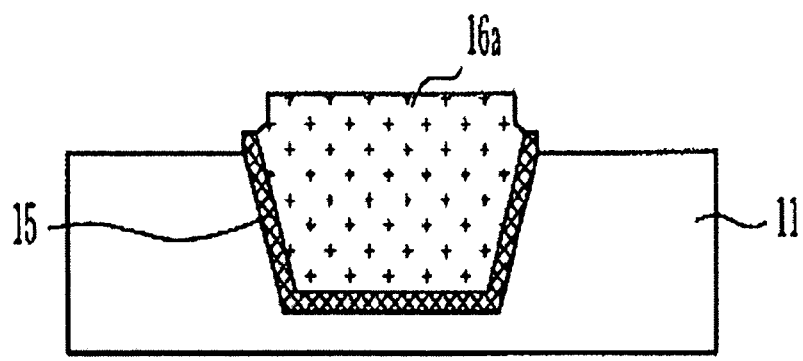
Figure 2A:
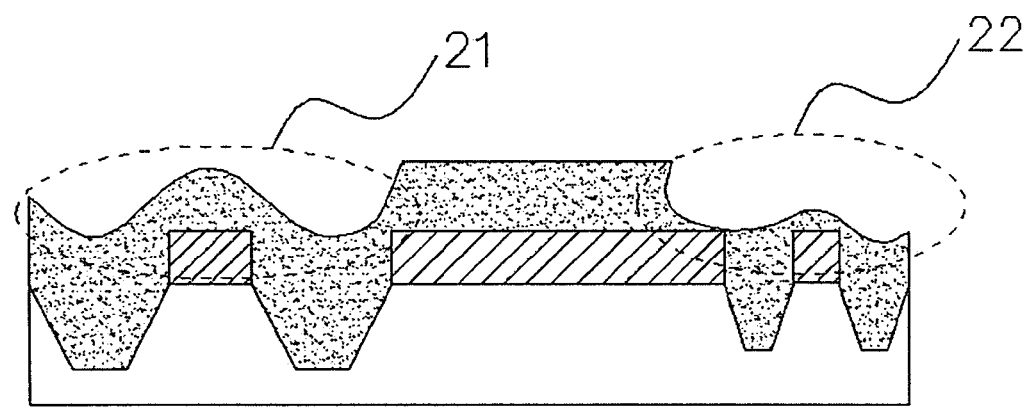
FIGS. 2a and 2b show the planarization of a known insulation layer.
Figure 2B:
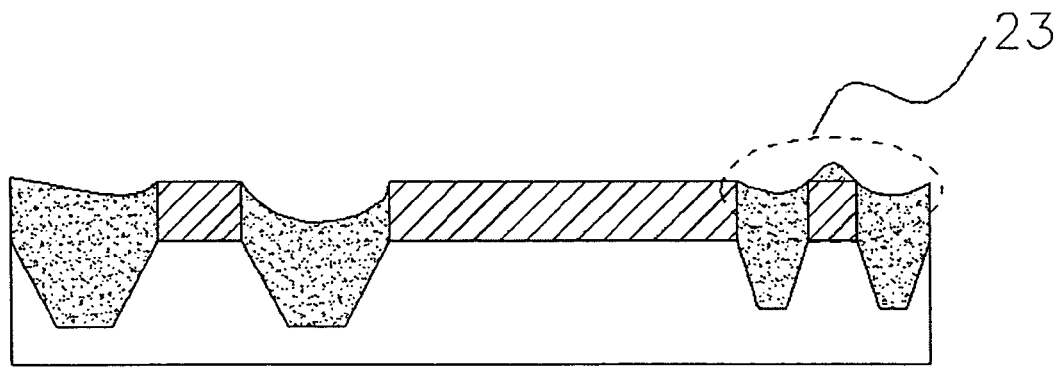
Figure 3A:
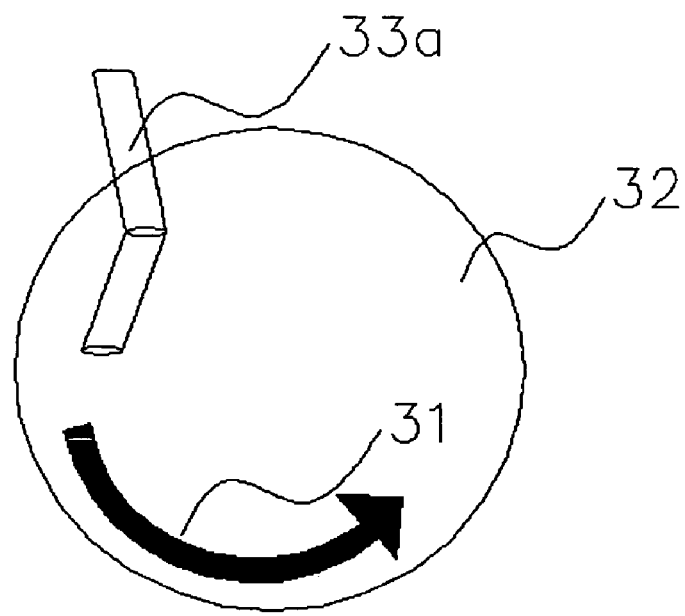
FIGS. 3a and 3b illustrate example processes of removing the residual insulation layer.
Figure 3B:
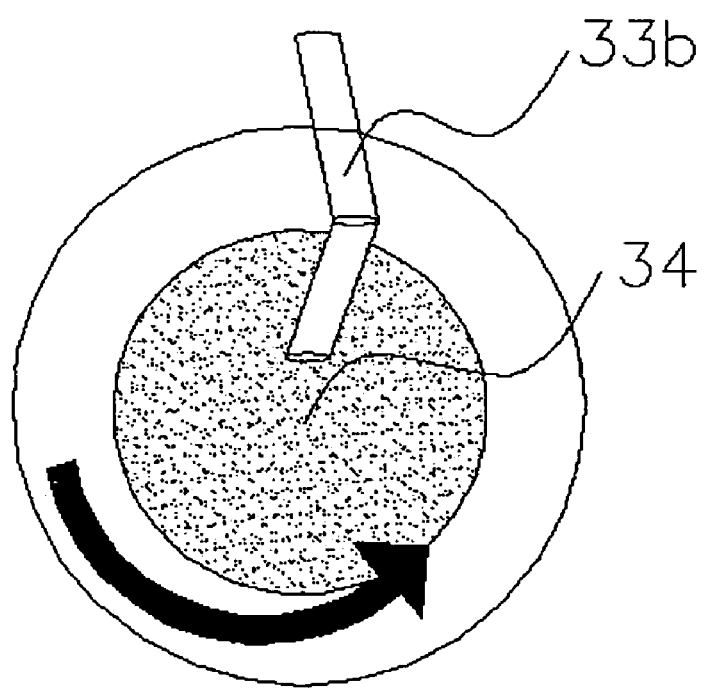

FIGS. 3a and 3b illustrate example processes of removing the residual insulation layer. Referring to FIG. 3a, the planarized substrate is loaded on equipment for wet etch. While the substrate is rotated 31 at a high speed, the insulation layer on the edge of the substrate is selectively and uniformly over-etched by injecting an etching solution 33a onto the edge of the substrate. Because the insulation layer is generally made of oxide, it is preferably etched by using hydrofluoric acid (hereinafter referred to as "HF") as an etching solution.

Referring to FIG. 3b, as a main process, the substrate rotating at a high speed is etched by injecting the etching solution 33b onto its center region 34. Therefore, the edge is uniformly over etched, so that the residual insulation layer that remains after the planarization process of the substrate is removed.

Accordingly, the example method described herein removes the residual insulation layer on the edge of the substrate using equipment for wet etch, exposing the hard mask positioned under the insulation layer.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of forming an STI comprising:
    performing a planarization process for a substrate on which a hard mask and an insulation layer are formed;
    selectively etching the insulation layer on the edge of the substrate by using wet etch equipment; and
    performing a main etching process in the center region of the substrate.

2. A method as defined by claim 1, wherein the insulation layer is made of oxide.

3. A method as defined by claim 1, wherein the insulation layer is formed on the substrate where an STI is formed.

4. A method as defined by claim 1, wherein the selective etching process over-etches the edge of the substrate by using HF.

* * * * *